(12) United States Patent
Cho et al.

(10) Patent No.: US 6,352,915 B1
(45) Date of Patent: Mar. 5, 2002

(54) METHOD FOR MANUFACTURING SEMICONDUCTOR PACKAGE CONTAINING CYLINDRICAL TYPE BUMP GRID ARRAY

(75) Inventors: Young-rae Cho; Wook-yeol Ryu; Sang-kyun Lee, all of Yongin (KR)

(73) Assignee: Samsung Aerospace Industries, Ltd., Kyoungsangnam-do (KR)

( * ) Notice: Subject to any disclaimer, the term of this patent is extended or adjusted under 35 U.S.C. 154(b) by 0 days.

(21) Appl. No.: 09/680,440

(22) Filed: Oct. 6, 2000

Related U.S. Application Data

(62) Division of application No. 09/221,598, filed on Dec. 29, 1998, now abandoned.

(30) Foreign Application Priority Data

Dec. 30, 1997 (KR) .............................................. 97-77722
Aug. 4, 1998 (KR) .............................................. 98-31705

(51) Int. Cl.[7] .............................................. H01L 21/44
(52) U.S. Cl. ...................... 438/613; 438/108; 438/121; 228/180.22; 29/840; 29/843
(58) Field of Search ....................... 228/180.21, 180.22; 438/106, 108, 109, 121, 612, 613, 112; 257/737, 738, 778; 29/800, 843, 844

(56) References Cited

U.S. PATENT DOCUMENTS

| | | | |
|---|---|---|---|
| 4,835,598 A | 5/1989 | Higuchi et al. ............. | 257/668 |
| 5,239,198 A | 8/1993 | Lin et al. .................... | 257/693 |
| 5,285,352 A | 2/1994 | Pastore et al. ............... | 361/707 |
| 5,404,265 A | 4/1995 | Moreseco et al. ........ | 361/306.1 |
| 5,468,995 A | 11/1995 | Higgins, III ................ | 257/697 |
| 5,468,999 A | 11/1995 | Lin et al. ..................... | 257/784 |
| 5,765,744 A | 6/1998 | Tatumi et al. .............. | 228/254 |
| 5,808,873 A | 9/1998 | Celaya et al. ............... | 361/760 |
| 5,969,461 A | 3/2000 | Anderson et al. ........... | 310/313 |
| 6,037,065 A | 3/2000 | Hajmrie et al. ............. | 428/570 |
| 6,043,429 A | 3/2000 | Blish, II et al. .............. | 174/35 |
| 6,120,301 A * | 9/2000 | Ichitani et al. .............. | 438/112 |

FOREIGN PATENT DOCUMENTS

| JP | 6-291122 | * 10/1994 |
|---|---|---|
| JP | 8-78554 | 3/1996 |

OTHER PUBLICATIONS

Official Notice to Submit Response Letter dated Jun. 30, 2000, Korean Industrial Property Office.

* cited by examiner

Primary Examiner—Olik Chaudhuri
Assistant Examiner—Alonzo Chambliss
(74) Attorney, Agent, or Firm—Finnegan, Henderson, Farabow, Garrett & Dunner LLP

(57) ABSTRACT

A method for manufacturing a semiconductor package comprising the steps of (a) forming a plurality of bumps on a metal frame and a bridge for connecting and supporting the bumps, (b) coating liquid solder on the bumps, (c) aligning the frame with respect to a semiconductor substrate where patterns are formed so that the bumps are positioned on the patterns, (d) soldering the bumps on the patterns, and (e) separating the bumps from the frame by breaking a connecting portion of the bumps and the bridge.

5 Claims, 5 Drawing Sheets

METHOD FOR MANUFACTURING SEMICONDUCTOR PACKAGE CONTAINING CYLINDRICAL TYPE BUMP GRID ARRAY

This is a division of application Ser. No. 09/221,598, filed Dec. 29, 1998, now abandoned all of which is incorporated herein by reference.

BACKGROUND OF THE INVENTION

1. Field of the Invention

The present invention relates to a semiconductor package, and more particularly, to a bump grid array package which is an improvement of a ball grid array package, and a manufacturing method therefor.

2. Description of the Related Art

A general semiconductor package is manufactured by mounting a semiconductor chip on a pad or a substrate and molding the semiconductor chip using resin, with connection means electrically connected with an external circuit substrate being provided in the lower surface of the substrate.

Referring to FIG. 1 showing a ball grid array package 10 which is a kind of the semiconductor package, a semiconductor chip 11 is bonded on a substrate 13 of the package 10 by a bonding agent 12. Patterns 14 and 14a are formed on upper and lower surfaces of the substrate 13, respectively. The patterns 14 and 14a are electrically connected with each other through a throughhole 16 formed to penetrate the substrate 13. Also, the upper pattern 14 is wire-bonded to the semiconductor chip 11 by a bonding wire 15, and a solder ball 17 is provided on the lower pattern 14a.

Also, in order to protect the semiconductor chip 11 and the bonding wire 15, the semiconductor chip 11 and the bonding wire 15 are molded using epoxy resin 18. Here, a dam 19 is formed on a predetermined position of the substrate 13 so that the epoxy resin 18 may not spread too widely on the upper surface of the substrate 13.

In fabricating the ball grid array package 10, the solder ball 17 having a diameter of 0.75 mm or less is placed on the lower pattern 14a of the substrate 13 and then soldered at a high temperature to then be bonded to the lower pattern 14a.

However, when the solder ball 17 is aligned on the lower pattern 14a for bonding the same thereon, the solder ball 17 may move, which causes misalignment of the solder ball 17, generation of double balls due to neighboring balls sticking to each other, or missing balls.

SUMMARY OF THE INVENTION

To solve the above problems, it is desirable to provide a method for manufacturing a stable semiconductor package by employing bumps which are cylindrical or whose cross-sectional shapes are constant and a frame for supporting the bumps, and the semiconductor package manufactured thereby.

Accordingly, there is provided a method for manufacturing a semiconductor package comprising the steps of (a) forming a plurality of bumps on a metal frame and a bridge for connecting and supporting the bumps, (b) coating liquid solder on the bumps, (c) aligning the frame with respect to a semiconductor substrate where patterns are formed so that the bumps are positioned on the patterns, (d) soldering the bumps on the patterns, and (e) separating the bumps from the frame by breaking a connecting portion of the bumps and the bridge.

Here, the step (a) comprises the steps of coating a photosensitive material on the metal frame, exposing the metal frame using a mask where patterns corresponding to the bumps and the bridge are formed, developing the metal frame, and etching the metal frame to form the bumps and the bridge.

Also, the method may further comprise the step of forming a notch at an end of the bridge connected to the bumps.

Alternatively, it is preferred that the method further comprises the step of half-etching the end of the bridge to form fracture portions at the end of the bridge connected to the bumps.

According to another aspect of the present invention, a semiconductor package comprising a substrate, a semiconductor chip mounted on the upper surface of the substrate, a first pattern formed on the upper surface of the substrate to be electrically connected with the semiconductor chip, a second pattern formed on the lower surface of the substrate to be electrically connected with the first pattern through throughholes formed to penetrate the substrate, and bumps which are cylindrical or whose cross-sectional shapes are constant, bonded on the second pattern.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Figure 1:
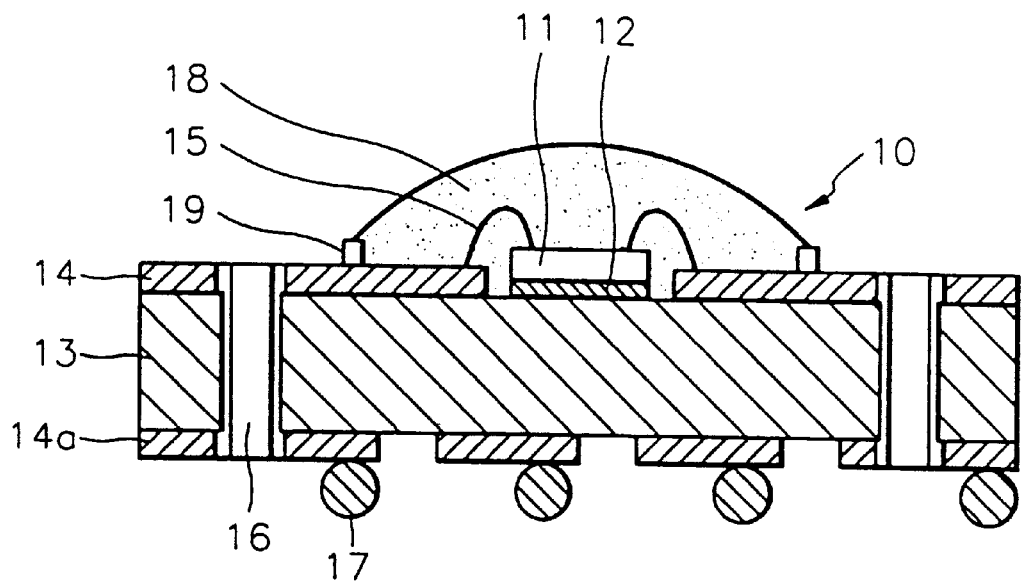
FIG. 1 is a cross-sectional view illustrating a conventional ball grid array package.
Figure 2:
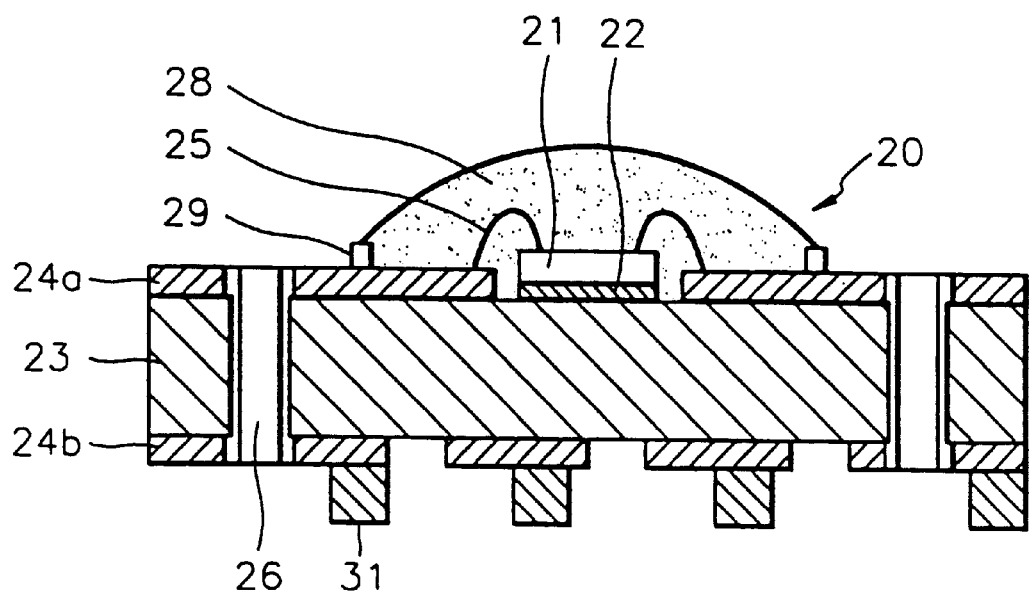
FIG. 2 is a cross-sectional view illustrating a bump grid array package according to the present invention.

Referring to FIG. 2 showing a bump grid array package 20 according to the present invention, a semiconductor chip 21 is bonded on a substrate 23 by an adhesive 22, and patterns 24a and 24b are formed on upper and lower surfaces of the substrate 23, respectively. The upper pattern 24a is electrically connected with the semiconductor chip 21 by a bonding wire 25. The lower pattern 24b is electrically connected with the upper pattern 24a through a plurality of throughholes 26 formed to penetrate the substrate 23.

Also, in order to protect the semiconductor chip 21 and the bonding wire 25, they are molded using epoxy resin 28. Here, a dam 29 is formed at a predetermined position of the substrate 23 so that the epoxy resin 28 may not spread on the upper surface of the substrate 23 too widely.

According to the features of the present invention, a plurality of cylindrical bumps 31 are bonded on the lower pattern 24b. The shapes of the bumps 31 are preferably cylindrical. However, the shapes of the bumps 31 are not limited to cylindrical shapes. The only restriction is that the cross-sectional shapes thereof have to be constant. In other words, the shapes and sizes of the bumps 31 have to be the same with one another.

Now, the method for bonding the bumps 31 will be described.

Figure 3:
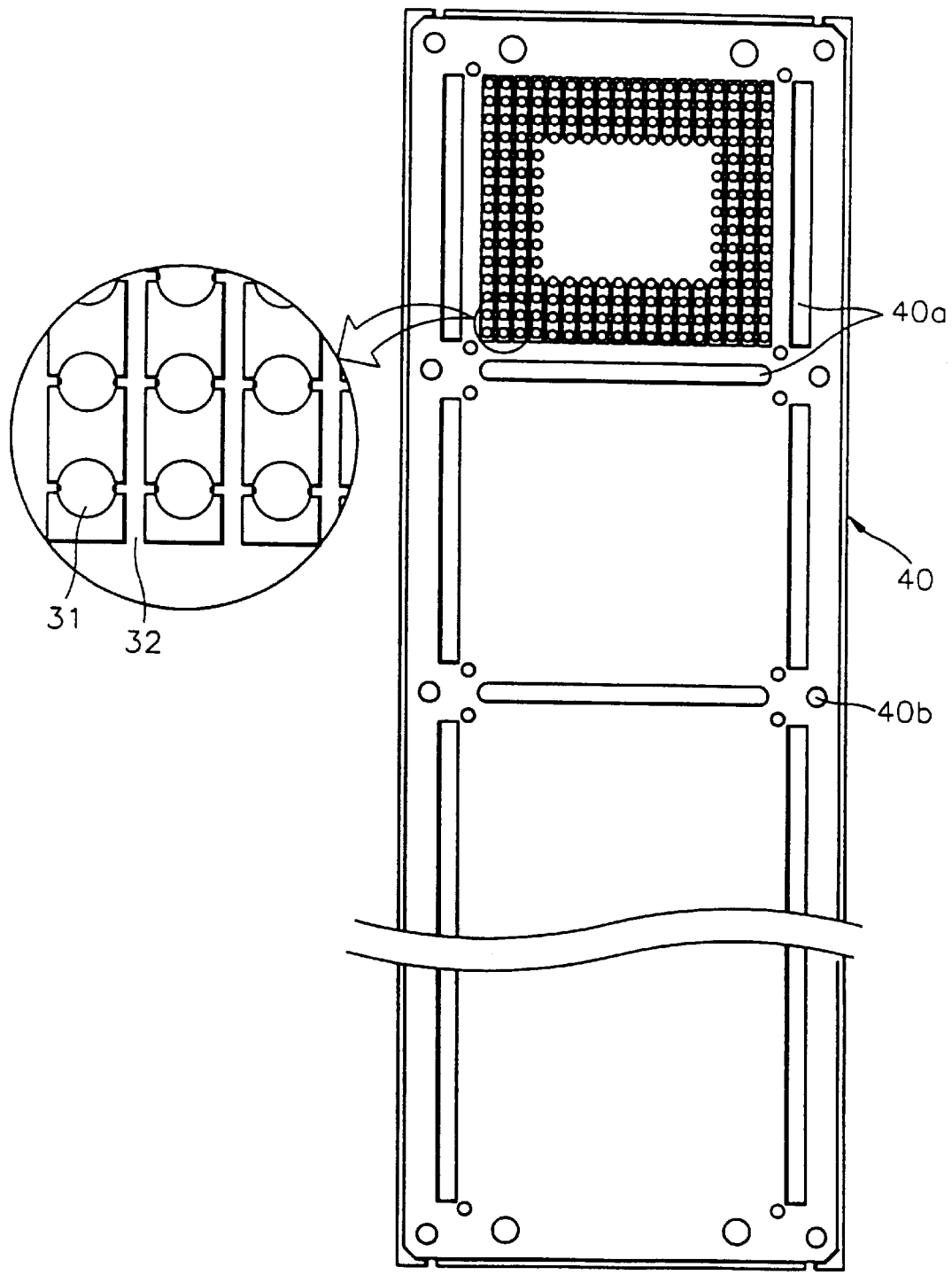
FIG. 3 is a plan view illustrating a metal frame having bumps employed in a semiconductor manufacturing method according to the present invention.
Figure 4:
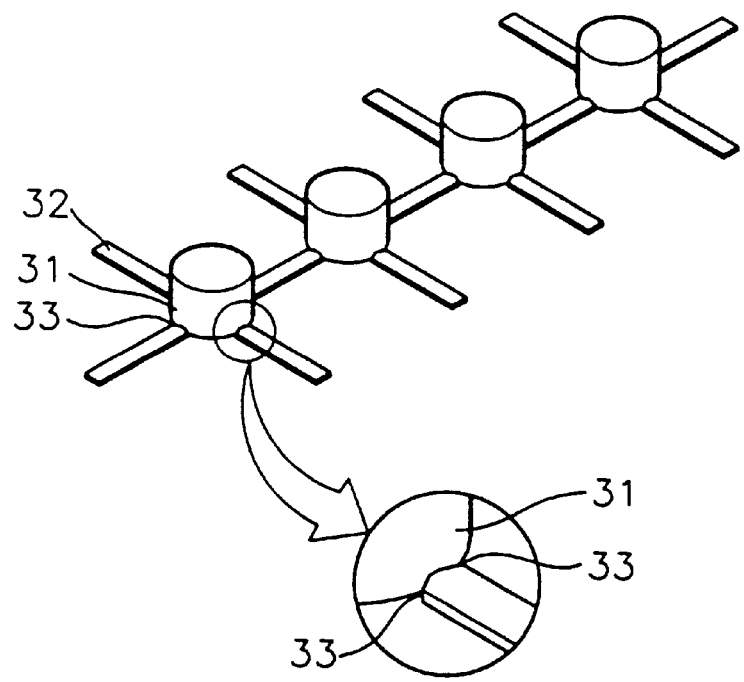
FIG. 4 is a perspective view illustrating the bumps and a bridge shown in FIG. 3.

The bumps 31, as shown in FIGS. 3 and 4, are formed in a metal frame 40. In other words, the plurality of bumps 31 are connected to a bridge 32 integrally formed with the frame 40 to then be supported. A guide slot 40*a* and a guide hole 40*b* are formed in the frame 40 for alignment of the bumps 31. The frame 40 is preferably formed of copper having excellent heat conductivity for facilitating soldering.

The method for forming the bumps 31 in the frame 40 will be described. First, a degreasing operation for removing foreign matter on the surface of the frame is performed using an acid or alkaline solution, and then photoresist which is a photosensitive material is coated on the surface of the frame 40.

Subsequently, the upper and lower surfaces of the frame 40 are exposed to light using a mask having a pattern corresponding to the bumps 31 and the bridge 32 connecting the bumps 31. If the exposure is completed, the photoresist is developed and then the frame 40 is etched.

In such a manner, the plurality of cylindrical bumps 31 and the bridge 32 connected with the bumps and supporting the same are formed in the frame 40. Preferably, a notch 33 is formed in a connecting portion between the bumps 31 and the bridge 32, which is for easily separating the bumps bonded on the lower pattern 24*b* of the substrate 23 from the bridge 32, as to be described later. As described above, the shapes of the bumps 31 are not limited to cylindrical ones and the only restriction is that the cross-sectional shapes thereof have to be constant. Alternatively, the notch 33 can be formed by performing a secondary etching separately after the primary etching for forming the bumps 31 and the bridge 32.

Figure 5:
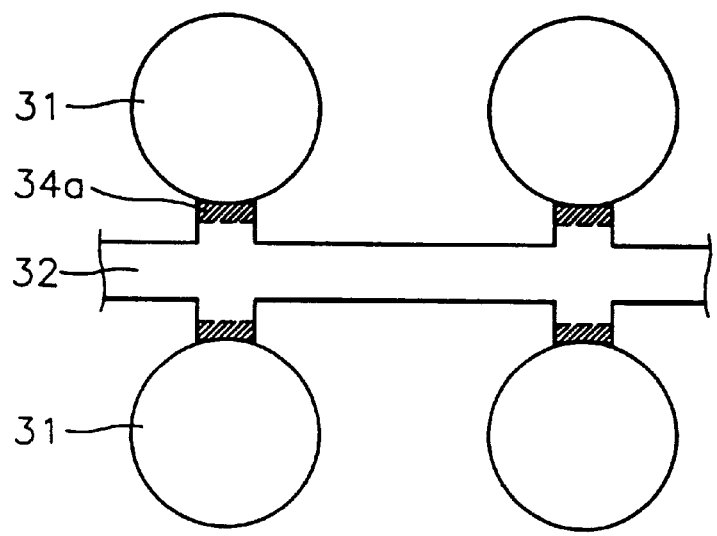
FIGS. 5 through 7 are plan views illustrating various examples of a connecting portion of the bumps and the bridge.

To facilitate separation of the bumps 31 and the bridge 32, in addition to the notch 33, a fracture portion 34*a* can be formed by half-etching the overall end of the bridge 32, as shown in FIG. 5.

Figure 6:
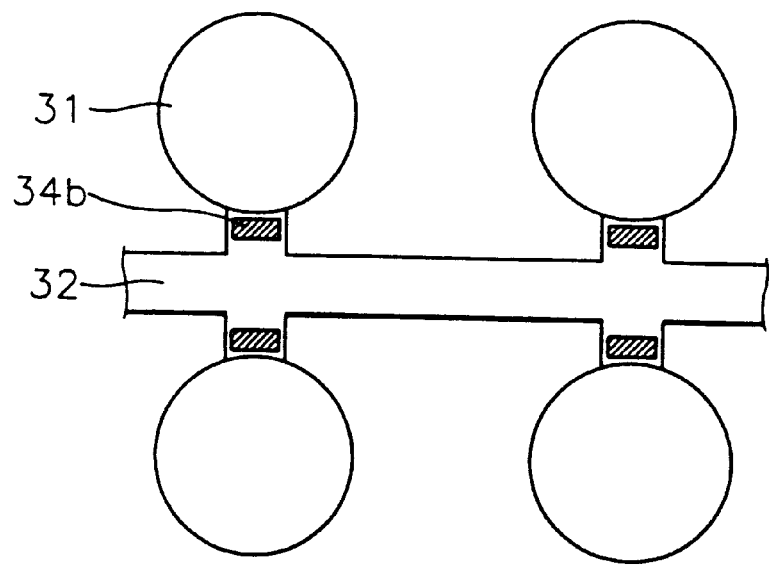
Figure 7:
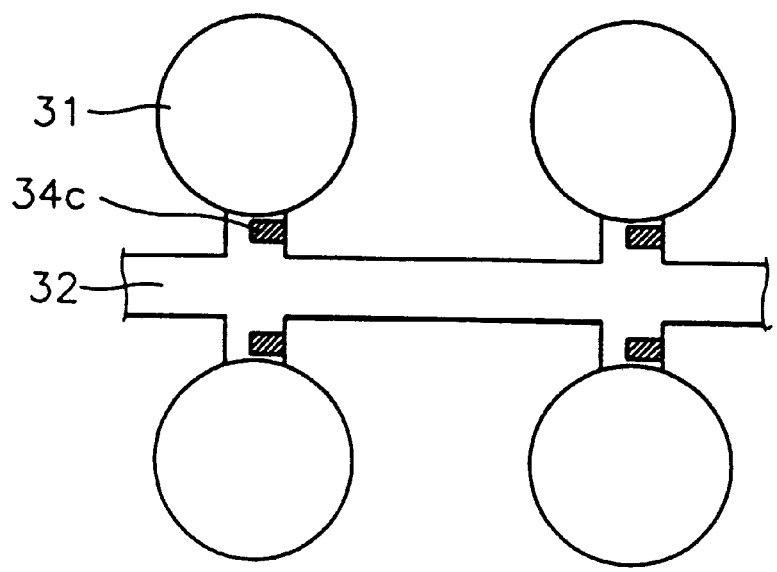

Also, as shown in FIGS. 6 and 7, fracture portions 34*b* and 34*c* may be formed by half-etching the center or edges of the end of the bridge 32.

Hereinbelow, the method for bonding the bumps 31 on the lower pattern 24*b* of the substrate 23 using the frame 40 formed with bumps 31 will be described.

Figure 8:
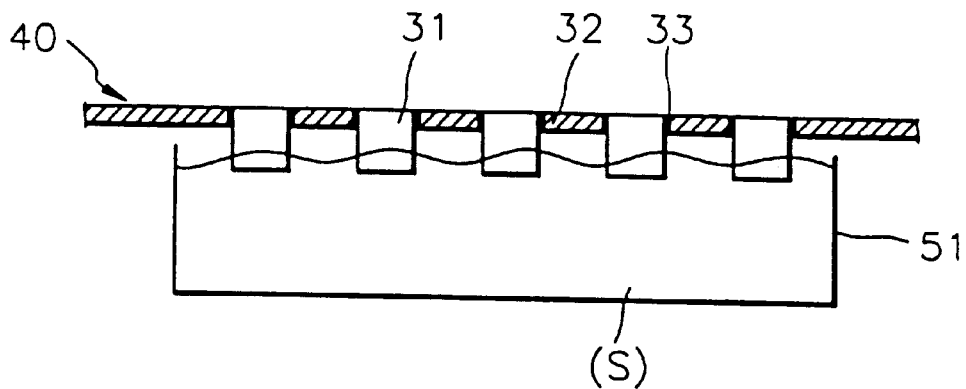
FIG. 8 is a side view illustrating a process of coating liquid solder on the bumps according to the present invention.

The frame 40 having the bumps 31 is submerged in a coating basin 51 containing liquid solder S to then be coated therewith, as shown in FIG. 8. When the liquid solder S is coated on both the bumps 31 and the bridge 32, the liquid solder S coated on the bridge 32 conglomerates by surface tension so that the liquid solder S coated on the bumps 31 does not become uniform. To solve such a problem, only the bumps 31 exclusive of the bridge 32 are submerged in the liquid solder S so that the liquid solder S is coated on only parts of the bumps 31.

Figure 9:
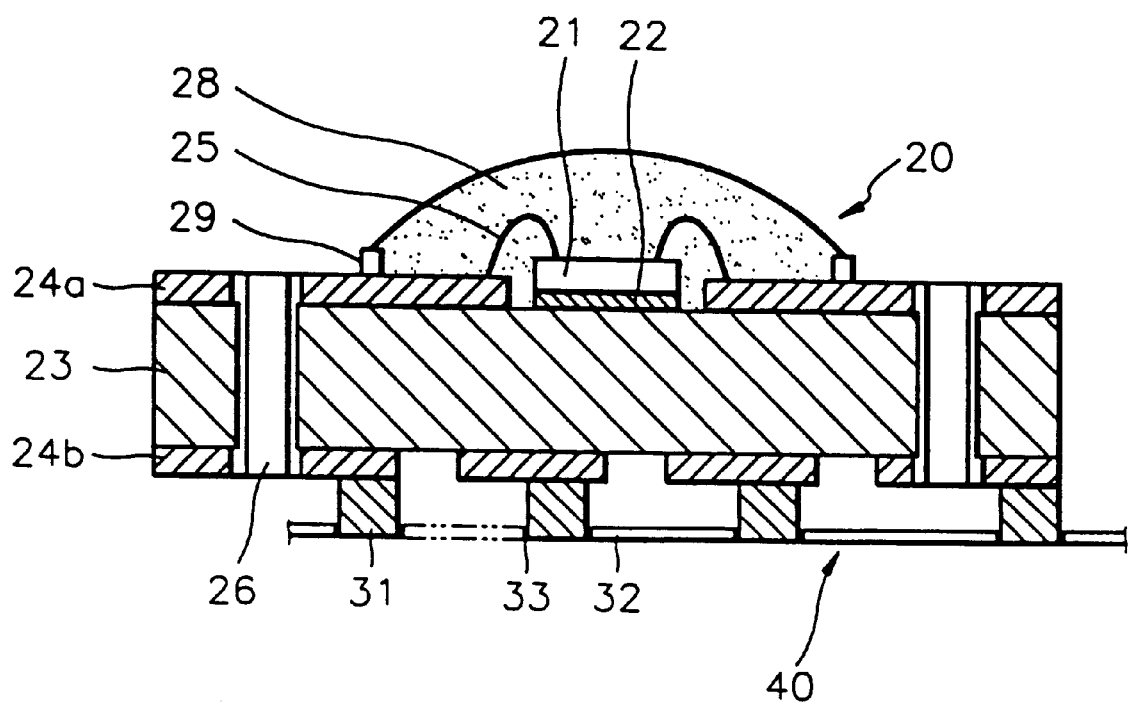
FIG. 9 is a side sectional view illustrating a state where the frame having bumps is aligned on a substrate.

Then, the frame 40 in which the liquid solder S is coated on the bumps 31 is Maligned on the lower surface of the substrate 23, as shown in FIG. 9, so that the bumps 31 are positioned on the lower pattern 24*b*. The alignment of the frame 40 with respect to the substrate 23 can be achieved by coupling the guide slot 40*a* and guide hole 40*b* formed in the frame 40 to an alignment member (not shown).

If the alignment of the frame 40 on the substrate 23 is completed, soldering is performed at a high temperature for the bumps 31 to be bonded on the lower pattern 24*b*.

Next, if the bumps 31 are completely bonded on the pattern 24*b*, the notch (33 of FIG. 4) or the fracture portion (34*a* of FIG. 5) is broken, thereby separating the bumps 31 from the bridge 32. In such a manner, the bridge 32 and the frame 40 can be removed.

According to the semiconductor package of the present invention and the manufacturing method therefor, a plurality of bumps can be simultaneously bonded on a pattern using a frame in which the plurality of bumps are connected by a bridge. Also, the frame can be easily aligned with respect to a substrate and the bumps are bonded by soldering while being supported to the frame, misalignment of the bumps or missing bumps are not produced. Therefore, the manufacturing process becomes simplified, defective proportion is reduced, and reliability of the semiconductor package is increased.

What is claimed is:

1. A method for manufacturing a semiconductor package comprising the steps of:

(a) forming a metal frame having a bridge connected to a plurality of bumps such that each of the bumps is supported by the metal frame;

(b) coating liquid solder on the bumps;

(c) aligning the frame with respect to a semiconductor substrate where patterns are formed so that the bumps are positioned on the patterns;

(d) soldering the bumps on the patterns; and (e) separating the bumps from the frame by breaking a connecting portion from the bridge.

2. The method according to claim 1, wherein the step (a) comprises the steps of:

coating a photosensitive material on the metal frame;

exposing the metal frame using a mask where patterns corresponding to the bumps and the bridge are formed;

developing the metal frame; and etching the metal frame to form the bumps and the bridge.

3. The method according to claim 1, further comprising the step of forming a notch at an end of the bridge connected to the bumps.

4. The method according to claim 1, further comprising the step of half-etching the end of the bridge to form fracture portions at the end of the bridge connected to the bumps.

5. The method according to claim 1, wherein in the step (b), the liquid solder is coated on only a part of the bumps.

* * * * *